US011016140B1

(12) United States Patent
Long et al.

(10) Patent No.: US 11,016,140 B1
(45) Date of Patent: May 25, 2021

(54) BATTERY DIODE FAULT MONITORING

(71) Applicant: Wisk Aero LLC, Mountain View, CA (US)

(72) Inventors: Geoffrey Alan Long, Montara, CA (US); Jing Xue, San Jose, CA (US); Khoichi Lawrence Takayama, San Jose, CA (US)

(73) Assignee: WISK AERO LLC, Mountain View, CA (US)

( * ) Notice: Subject to any disclaimer, the term of this patent is extended or adjusted under 35 U.S.C. 154(b) by 196 days.

(21) Appl. No.: 16/177,255

(22) Filed: Oct. 31, 2018

(51) Int. Cl.
*G01R 31/26* (2020.01)
*H01M 50/572* (2021.01)

(52) U.S. Cl.
CPC ...... *G01R 31/2632* (2013.01); *H01M 50/572* (2021.01)

(58) Field of Classification Search
CPC .... G01R 31/2632; G01R 31/50; G01R 31/52; H02J 7/0031; H02H 3/066; H02H 3/12
See application file for complete search history.

(56) References Cited

U.S. PATENT DOCUMENTS

2010/0259856 A1* 10/2010 Senriuchi ............ H02J 7/0031
361/49
2019/0056444 A1* 2/2019 Dragoi .................. G01R 31/50

* cited by examiner

*Primary Examiner* — Minh N Tang
(74) *Attorney, Agent, or Firm* — Kilpatrick Townsend & Stockton LLP

(57) ABSTRACT

A system is disclosed to detect failure of a diode that is connected in series with a battery and a contactor or other switch configured to connect the battery to a load when the contactor or other switch is in a closed position and to isolate the battery from the load when the contactor or other switch is in an open position. In various embodiments, the system includes a high value resistor connected between the anode terminal of the diode and ground, the connection to the anode terminal being on a load side of the contactor or other switch; and a voltage meter configured to measure a voltage across the high value resistor at least during a test in which a voltage is applied to a bus associated with the load while the contactor or other switch is in the open position.

17 Claims, 3 Drawing Sheets

BATTERY DIODE FAULT MONITORING

BACKGROUND OF THE INVENTION

Battery-powered systems may include multiple batteries to drive multiple loads. For example, an electric aircraft or other vehicle may include a plurality of high voltage batteries that power a propulsion system comprising multiple loads, such as a plurality of electric motors. This arrangement may be used to provide redundancy and/or fault tolerance, for example.

Such a system may include contactors that are open when the propulsion system is not in use and closed just prior to use. This approach ensures safety by reducing the amount of the system that has high voltage.

The system may include diodes interposed between the respective batteries and the loads. In the case of a battery failure in which a cell fails short, the affected battery could have a substantially lower voltage than the other batteries. This would cause a large amount of current to flow from the good batteries to the bad battery and there is a risk that other structures provided to protect the other batteries, such as battery fuses, might fail or be damaged.

The diodes may also enable batteries to discharge more evenly in the scenario where each of the batteries has a different state of health.

These diodes may be deemed important to the system. Therefore, it would be useful to have a way to determine if they have failed. A possible failure mode is one in which the diode is shorted, i.e., no longer prevents current from flowing back through the diode.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Techniques are disclosed to detect that a diode interposed between one of a plurality of batteries and a plurality of loads has failed by becoming shorted (also known as "short-circuited" or "failed closed"). In various embodiments, a high value resistor is connected between the input terminal (anode) of the diode and ground. Contactors (or other switches or connectors) associated with one or more batteries with which the diode being tested is not associated are closed. Voltage is measured across the high value resistor. If greater than a threshold voltage is detected, it is determined the diode being tested has failed "short".

Figure 1:
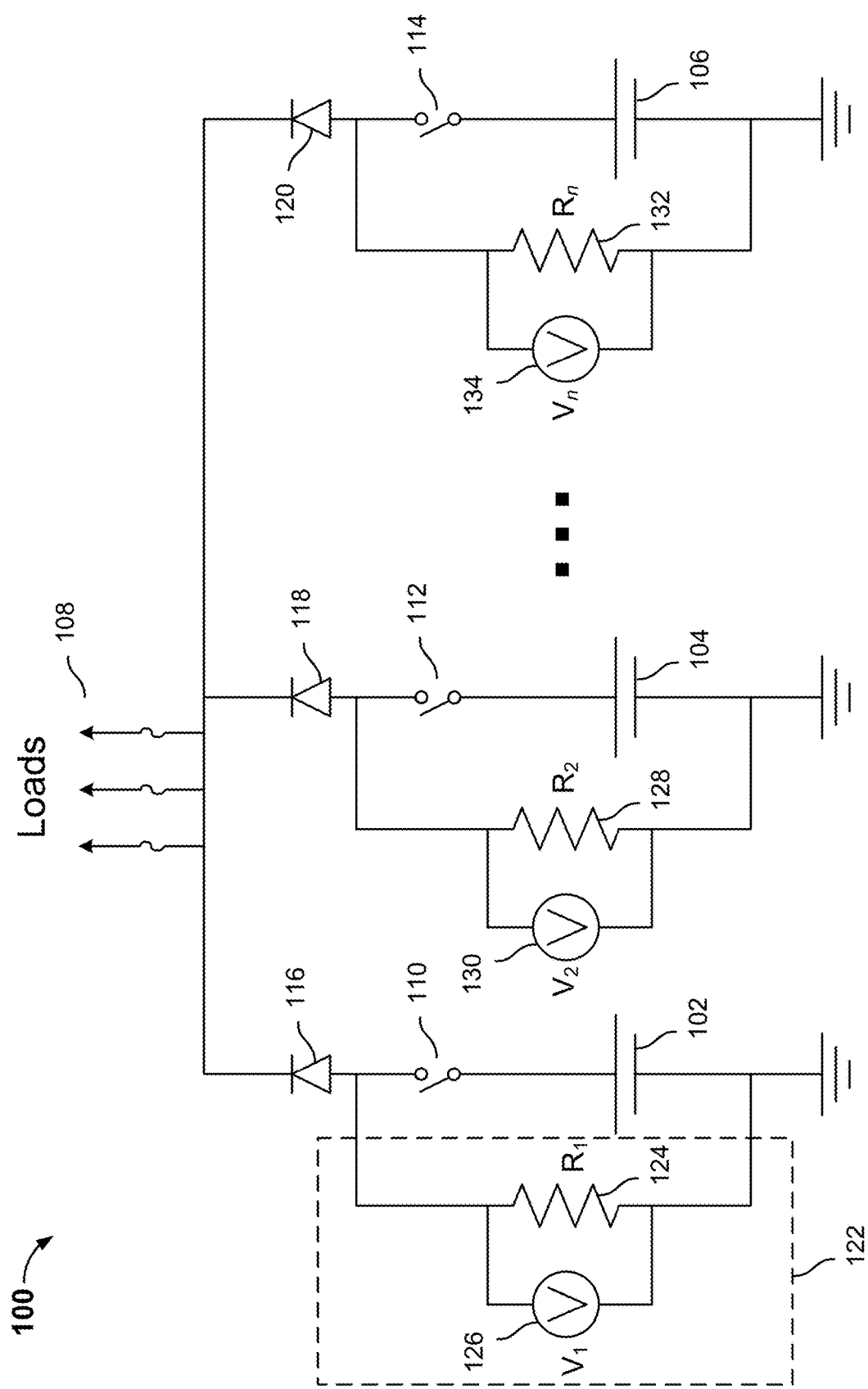
FIG. 1 is a circuit diagram illustrating an embodiment of a battery diode fault monitoring system.

FIG. 1 is a circuit diagram illustrating an embodiment of a battery diode fault monitoring system. In the example shown, battery diode fault monitoring system 100 includes a plurality of batteries, represented in FIG. 1 by batteries 102, 104, and 106. Each battery is configured to be connected to a common set of loads 108, e.g., a plurality of motors or other loads, by a corresponding contactor or other switch or connector, such as contactors 110, 112, and 114 in the example shown.

Each of the batteries (e.g., 102, 104, and 106) is protected and isolated by an associated diode, such as diodes 116, 118, and 120 in the example shown. In various embodiments, in the case of a battery failure in which a cell fails short, the affected battery could have a substantially lower voltage than the other batteries. In such a failure scenario, the diode (e.g., 116, 118, or 120) associated with the failed battery would prevent current flow from the good batteries to the bad battery. In various embodiments, the diodes 116, 118, and 120 may also enable batteries to discharge more evenly in the scenario where each of the batteries has a different state of health.

To enable failures in which one or more of the diodes 116, 118, and 120 has failed "short" to be detected, a battery diode fault detection circuit, such as fault detection circuit 122 in the example shown, is provided with respect to each battery, e.g., 102, 104, and 106. In the example shown, battery diode fault detection circuit 122 includes a high value resistor 124, e.g., a few kilohms or so, connected between the input (anode) terminal of the diode 116 and ground. A voltage meter 126 is provided, in this example, to measure voltage across the high value resistor 124. Similarly, a battery diode fault detection circuit comprising high value resistor 128 and voltage meter 130 is provided with respect to diode 118; and a battery diode fault detection circuit comprising high value resistor 132 and voltage meter 134 is provided with respect to diode 120.

In various embodiments, battery diode fault monitoring is performed at least in part by closing one or more contactors associated with batteries corresponding to battery diodes not currently being tested while leaving open the contactor associated with the battery diode that is being tested. If the voltage across the high value resistor comprising the battery diode fault detection circuit, e.g., resistor 124 in FIG. 1, is determined to be greater than a threshold voltage, the corresponding diode, e.g., diode 116, is determined to have failed "short". The testing procedure is repeated with respect to one or more diodes not tested previously, using one or more of the other batteries, the diodes of which were tested in a previous iteration, to test the diode(s) that has/have not been tested. Once all diodes have been tested and passed, the battery diode fault monitoring procedure is determined to have been completed satisfactorily.

Figure 2:
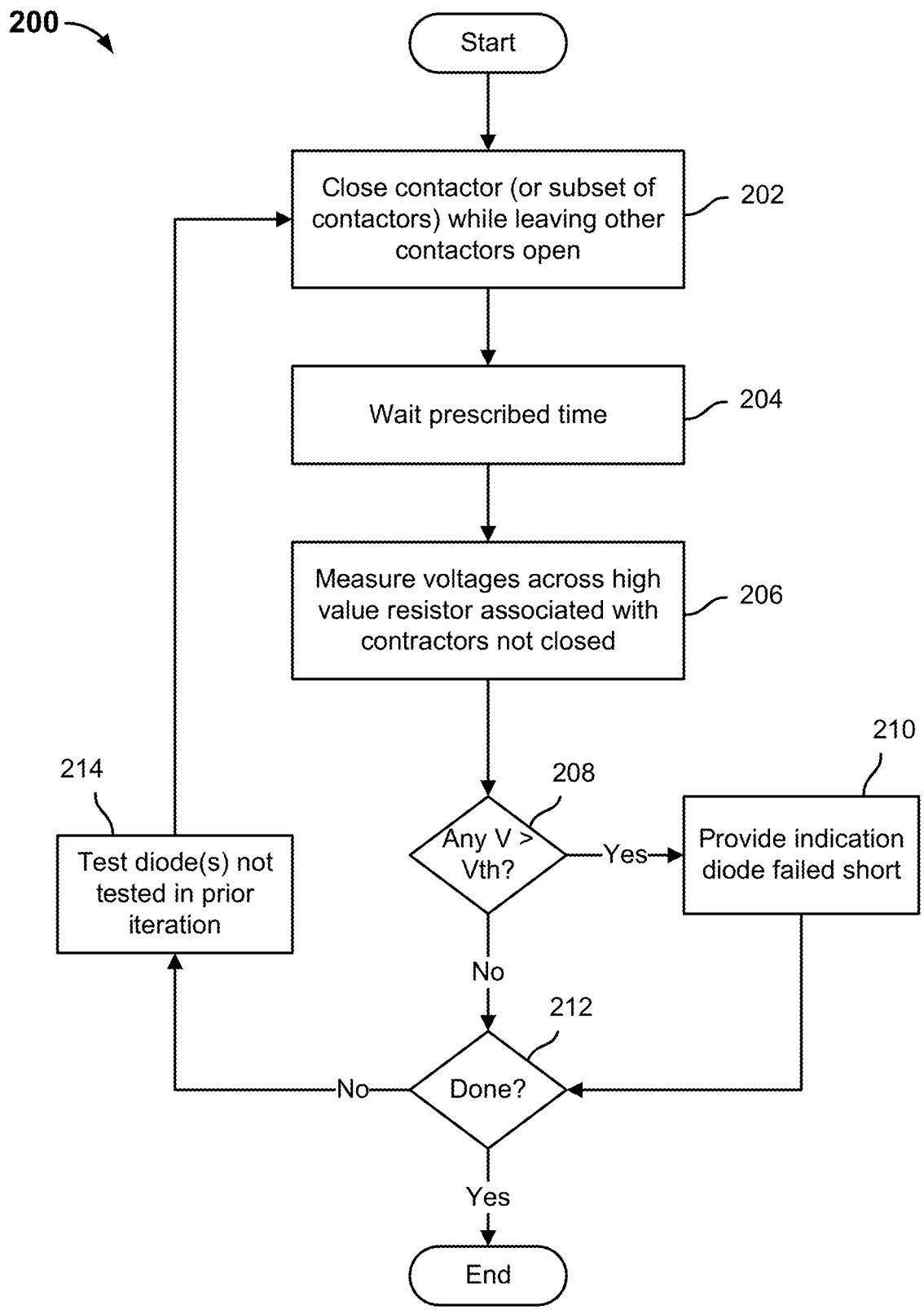
FIG. 2 is a flow chart illustrating an embodiment of an embodiment of a process to monitor a battery diode for faults.

FIG. 2 is a flow chart illustrating an embodiment of an embodiment of a process to monitor a battery diode for faults. In various embodiments, a processor, control circuit, computer, or other processing device or component may be programmed to implement the process 200 of FIG. 2 to perform battery diode fault monitoring as disclosed herein. In the example shown, a contactor associated with a battery (or a subset set of contactors associated with a subset of batteries) is/are closed while leaving one or more other contactors associated with other batteries open (202). For example, in the example shown in FIG. 1, the contactor 110 may be closed while leaving contactors 112 and 114 open. The system waits for a prescribed time (204). In various embodiments, the wait is for a time determined based at least in part on capacitances of the power distribution system. Once the prescribed time has elapsed (204), the respective voltage across each of the high value resistors associated with batteries the contactors of which were not closed, e.g., voltage meter 130 associated with resistor 128 and voltage meter 134 across resistor 132, in the example shown in FIG. 1, are read and compared to a detection threshold voltage (206). If any measure voltage exceeds the detection threshold (208), an indication is provided that the associated battery diode has failed short (210). Otherwise, processing proceeds to testing any diode(s) not tested in a previous iteration (212, 214). For example, a subsequent test in which contactor 112 is closed while leaving contactor 110 open may be performed (202). After the prescribed time (204), the voltage across resistor 124 is measured (206). If the measured voltage exceeds the detection threshold (208), an indication is provided that the associated battery diode has failed short (210). If not, and if no other diodes remain to be tested (212), the process ends.

Figure 3:
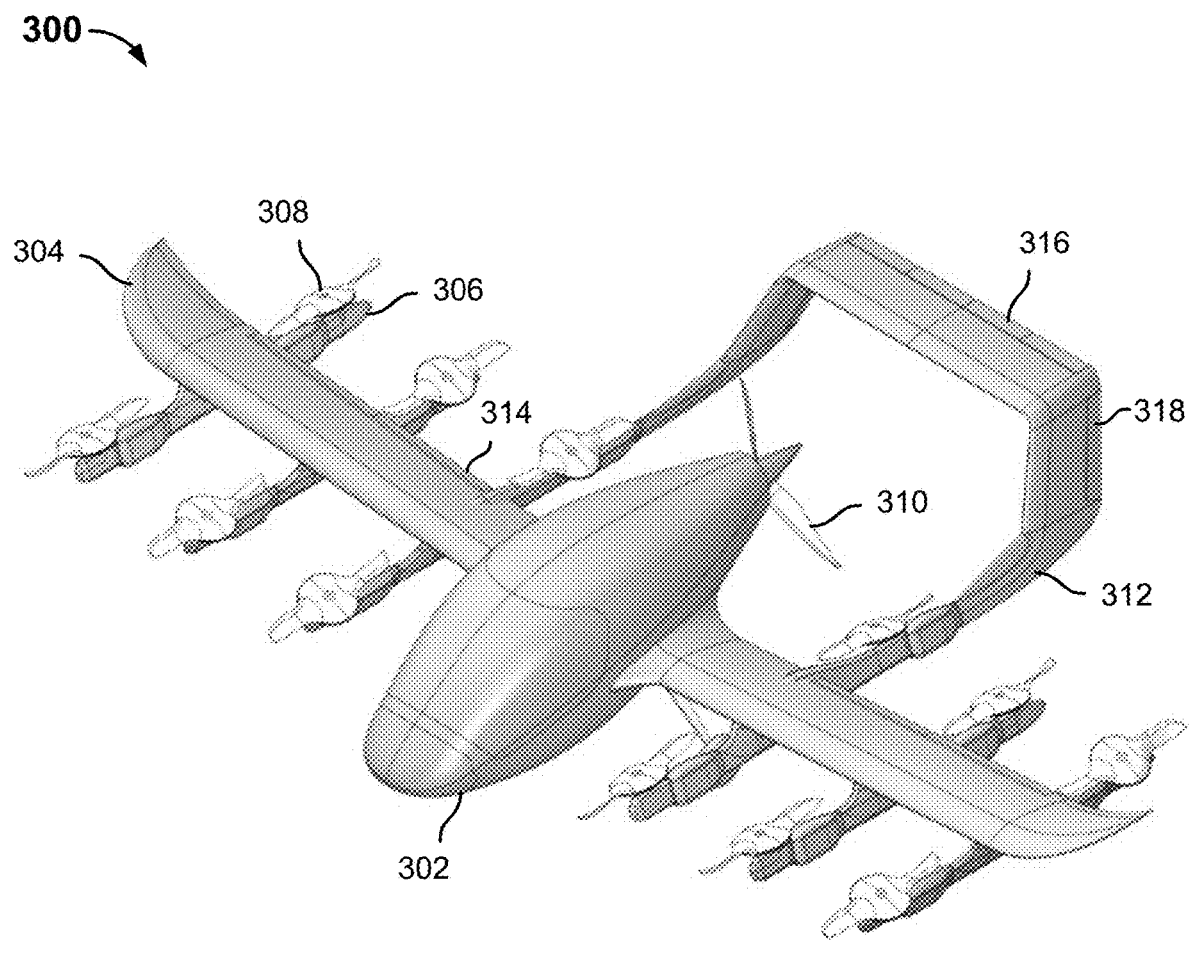
FIG. 3 is a diagram illustrating an embodiment of an electric vertical take-off and landing (VTOL) aircraft.

FIG. 3 is a diagram illustrating an embodiment of an electric vertical take-off and landing (VTOL) aircraft. In various embodiments, a battery diode fault monitoring system such as battery diode fault monitoring system 100 of FIG. 1 may be embodied in an aircraft such as aircraft 300 of FIG. 3. In the example shown, aircraft 300 includes a fuselage (body) 302 and wings 304. A set of three underwing booms 306 is provided under each wing. Each boom 306 has two lift fans 308 mounted thereon, one forward of the wing and one aft. Each lift fan 308 may be driven by an associated drive mechanism, such as a dedicated electric motor. A plurality of batteries (not shown in FIG. 3) may be used to drive the lift fans 308. For example, in some embodiments, batteries such as batteries 102, 104, and 106 of FIG. 1 may be used to power motors configured to rotate the lift fans 308.

In the example shown in FIG. 3, propeller 310 is mounted on the fuselage 302 and configured to push the aircraft through the air in the forward (e.g., x axis) direction. The propeller 310 is positioned between a pair of booms 312 that extend aft and are joined at their aft end by a tail structure on which aerodynamic control surfaces including elevators 316 and rudder 318 are mounted. Additional control surfaces include ailerons 314 mounted on the trailing edge of wings 304.

In various embodiments, aircraft 300 includes a flight control system that embodies an aerodynamic model generated based on a sparse set of simulation results, as disclosed herein. For a given set of desired forces and moments, the flight control system uses the model to determine a set of actuators and for each a corresponding set of actuator parameters to achieve the desired forces and moments. For example, all or a subset of actuators such as the lift fans 208 and/or selected ones of them; propeller 310; and control surfaces such as ailerons 314, elevators 316, and/or rudders 318 may be selected, and for each an associated set of parameters determined and applied (e.g., a corresponding RPM, which equates to torque, for each lift fan 308 included in the mix; position angles for each selected control surface; etc.).

In various embodiments, a plurality of batteries may be provided to power motors associated with the respective lift fans 308. Each battery may be protected by a diode, such as diodes 116, 118, and 120 of FIG. 1. In various embodiments, each diode is monitored by an associated battery diode fault detection circuit, such as battery diode fault detection circuit 122 of FIG. 1. A flight control or other monitoring system comprising the aircraft 300 may be used in various embodiments to monitor for battery diode failure as disclosed herein. For example, the flight control or other monitoring system may be configured to perform the process 200 of FIG. 2 to detect diode failure.

In various embodiments, techniques disclosed herein may enable a battery diode failure in which the diode has failed "short" to be detected.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system to detect failure of a diode having an anode terminal and a cathode terminal, wherein the diode is connected in series with a battery and a switch configured to electrically connect the battery to a load when the switch is in a closed position and to electrically isolate the battery from the load when the switch is in an open position, the system comprising:

a resistor connected between the anode terminal of the diode and a ground, wherein the resistor is connected to the anode terminal of the diode on a load side of the switch;

a voltage meter configured to measure a measurement voltage across the resistor at least during a test in which a node voltage is applied to a node associated with the load while the switch is in the open position; and a processor configured to cause the node voltage to be applied to the node associated with the load, to use the voltage meter to measure the measurement voltage across the resistor, and to detect a short condition in the diode based at least in part on a determination that the measurement voltage exceeds a detection threshold voltage.

2. The system of claim 1, wherein the battery comprises a first battery included in a plurality of batteries, each particular battery of the plurality of batteries having associated therewith a corresponding switch configured to connect the particular battery to the node associated with the load.

3. The system of claim 2, wherein the processor is configure to apply the node voltage to the node associated with the load by closing the respective switch associated with one or more of said batteries other than the first battery while causing the switch associated with the first battery to remain open.

4. The system of claim 3, wherein the processor is further configured to perform a second test in which:
the switch associated with the first battery is closed;
the respective switch associated with each of one or more batteries in the plurality of batteries other than the first battery remains in the open position; and
for each respective battery of the plurality of batteries, the corresponding switch, which remains in the open position, a respective measurement voltage is read across a corresponding resistor associated with the respective battery.

5. The system of claim 4, wherein the processor is further configured to detect failure of a corresponding diode associated with one particular battery of said batteries other than the first battery based at least in part on a determination that the respective measurement voltage read across the corresponding resistor associated with the one particular battery exceeds the detection threshold voltage.

6. The system of claim 1, wherein the processor is configured to apply the node voltage to the node associated with the load for a prescribed time interval before using the voltage meter to measure the measurement voltage across the resistor.

7. The system of claim 6, wherein the prescribed time interval is determined at least in part based on a capacitance associated with the node.

8. A method to detect failure of a diode having an anode terminal and a cathode terminal, wherein the diode is connected in series with a battery and a switch configured to electrically connect the battery to a load when the switch is in a closed position and to electrically isolate the battery from the load when the switch is in an open position, wherein a resistor is connected between the anode terminal of the diode and a ground, and wherein the resistor is connected to the anode terminal of the diode on a load side of the switch, the method comprising:
applying a node voltage to a node associated with the load while the switch is in the open position;
using a voltage meter to measure a measurement voltage across the high value resistor while the node voltage is being applied to the node associated with the load while the switch is in the open position;
comparing the measurement voltage to a detection threshold; and
determining that the diode has failed short based on a determination that the measurement voltage exceeds the detection threshold.

9. The method of claim 8, wherein the battery comprises a first battery included in a plurality of batteries, each particular battery of the plurality of batteries having associated therewith a corresponding switch configured to electrically connect the particular battery to the node associated with the load.

10. The method of claim 9, wherein the node voltage is applied to the node associated with the load by closing the respective switch associated with one or more of said batteries other than the first battery while causing the switch associated with the first battery to remain open.

11. The method of claim 10, further comprising performing a second test, in which:
the switch associated with the first battery is closed;
the respective switch associated with each of one or more batteries in the plurality of batteries other than the first battery remains in the open position; and
for each respective battery of the plurality of batteries, the corresponding switch, which remains in the open position, a respective measurement voltage is read across a corresponding resistor associated with the respective battery.

12. The method of claim 8, wherein the node voltage is applied to the node associated with the load for a prescribed time interval before using the voltage meter to measure the measurement voltage across the resistor.

13. The method of claim 12, wherein the prescribed time interval is determined at least in part based on a capacitance associated with the node.

14. A computer program product to detect failure of a diode having an anode terminal and a cathode terminal, wherein the diode is connected in series with a battery and a switch configured to electrically connect the battery to a load when the switch is in a closed position and to electrically isolate the battery from the load when the switch is in an open position, wherein a resistor is connected between the anode terminal of the diode and a ground, and wherein the resistor is connected to the anode terminal of the diode on a load side of the switch, the computer program product being embodied in a non-transitory computer readable medium and comprising computer instructions for:
applying a node voltage to a node associated with the load while the switch is in the open position;
using a voltage meter to measure a measurement voltage across the resistor while the node voltage is being applied to the node associated with the load while the switch is in the open position;
comparing the measurement voltage to a detection threshold; and
determining that the diode has failed short based on a determination that the measurement voltage exceeds the detection threshold.

15. The computer program product of claim 14, wherein the battery comprises a first battery included in a plurality of batteries, each particular battery of the plurality of batteries having associated therewith a corresponding switch configured to electrically connect the particular battery to the node associated with the load.

16. The computer program product of claim 15, wherein the node voltage is applied to the node associated with the load by closing the respective switch associated with one or more of said batteries other than the first battery while causing the switch associated with the first battery to remain open.

17. The computer program product of claim 16, further comprising computer instructions for performing a second test, in which:
the switch associated with the first battery is closed;
the respective switch associated with each of one or more batteries in the plurality of batteries other than the first battery remains in the open position; and
for each respective battery of the plurality of batteries, the corresponding switch, which remains in the open position, a respective measurement voltage is read across a corresponding resistor associated with the respective battery.

* * * * *